United States Patent
Laughery et al.

(10) Patent No.: US 6,780,550 B2
(45) Date of Patent: Aug. 24, 2004

(54) SINGLE PASS LITHOGRAPHY OVERLAY TECHNIQUE

(75) Inventors: Mike Laughery, Austin, TX (US); Makoto Miyagi, Austin, TX (US)

(73) Assignee: Timbre Technologies, Inc., Santa Clara, CA (US)

( * ) Notice: Subject to any disclaimer, the term of this patent is extended or adjusted under 35 U.S.C. 154(b) by 203 days.

(21) Appl. No.: 10/187,258

(22) Filed: Jun. 28, 2002

(65) Prior Publication Data

US 2004/0002011 A1 Jan. 1, 2004

(51) Int. Cl.⁷ .............................. G03F 9/00; G03C 5/00
(52) U.S. Cl. ........................... 430/22; 430/30; 430/312
(58) Field of Search .............................. 430/22, 30, 312

(56) References Cited

U.S. PATENT DOCUMENTS 5,876,883 A * 3/1999 Leroux ........................ 430/22

* cited by examiner

*Primary Examiner*—Christopher G. Young
(74) *Attorney, Agent, or Firm*—Morrison & Foerster LLP

(57) ABSTRACT

A method and apparatus for measuring the alignment of masks in a photolithographic process. A first grating is formed having lines and spaces on a wafer using a first mask having a pattern for the first grating. A second grating is formed having lines and spaces on the wafer using a second mask having a pattern for the second grating and also the pattern for forming the first grating. A determination is then made based on the difference in the width of either the lines or the spaces of the first and second gratings formed on the wafer if the first and second masks are misaligned.

22 Claims, 17 Drawing Sheets

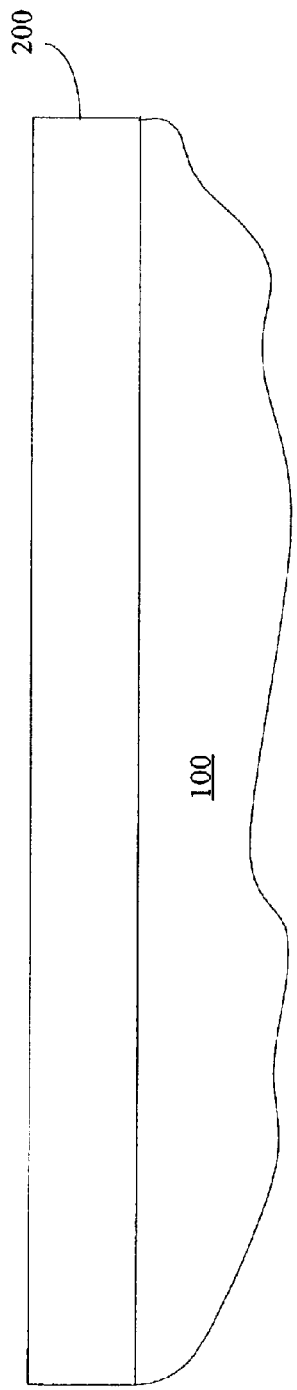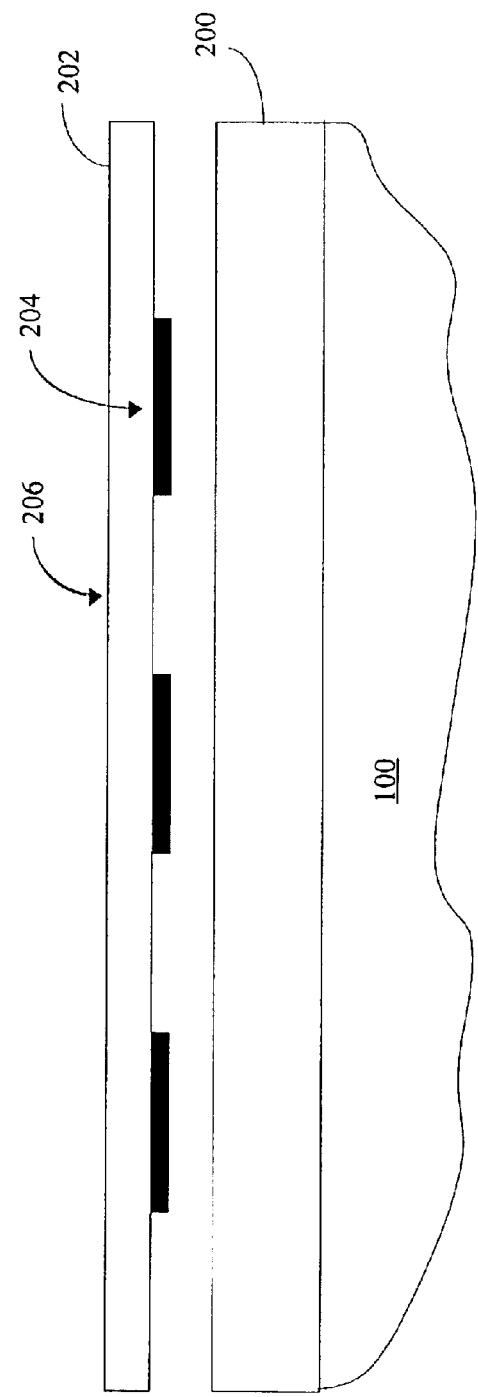
Figure 2-A
Figure 2-B

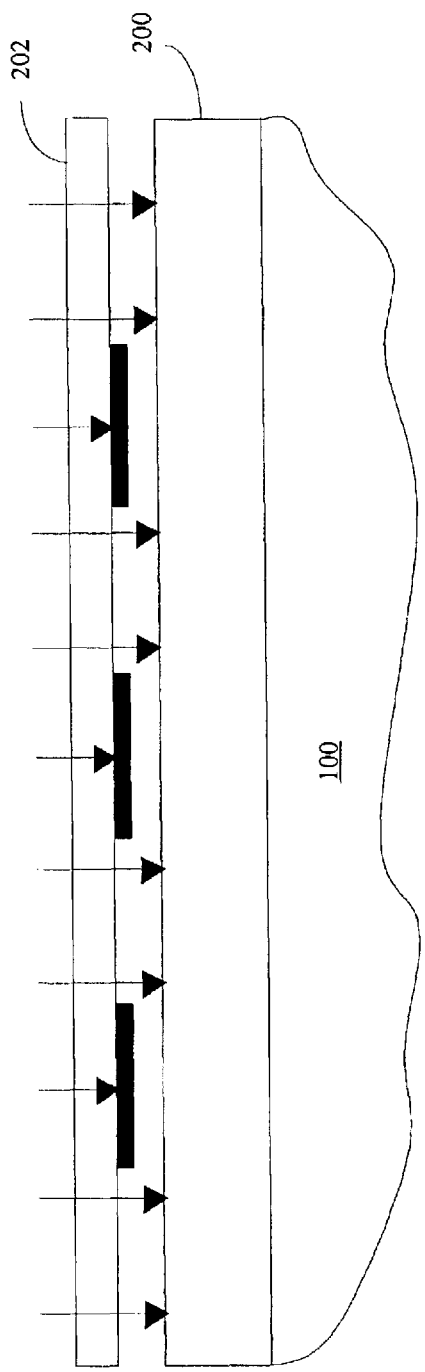
Figure 2-C
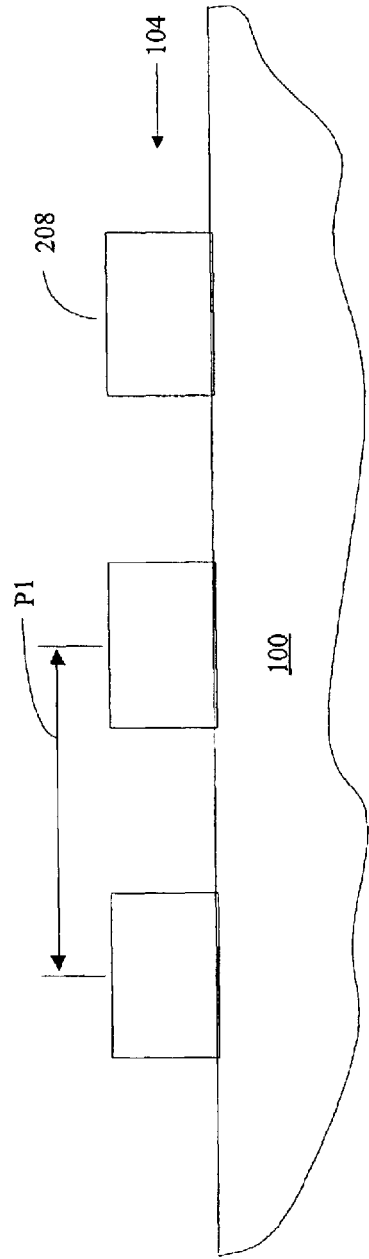
Figure 2-D

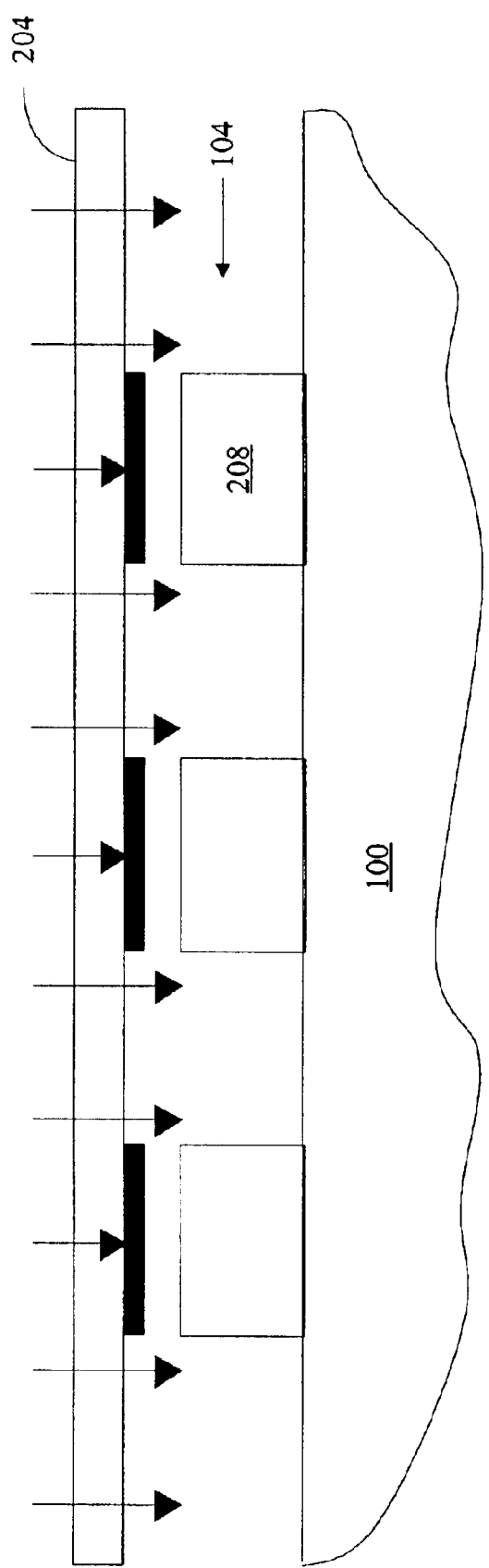
Figure 2-E

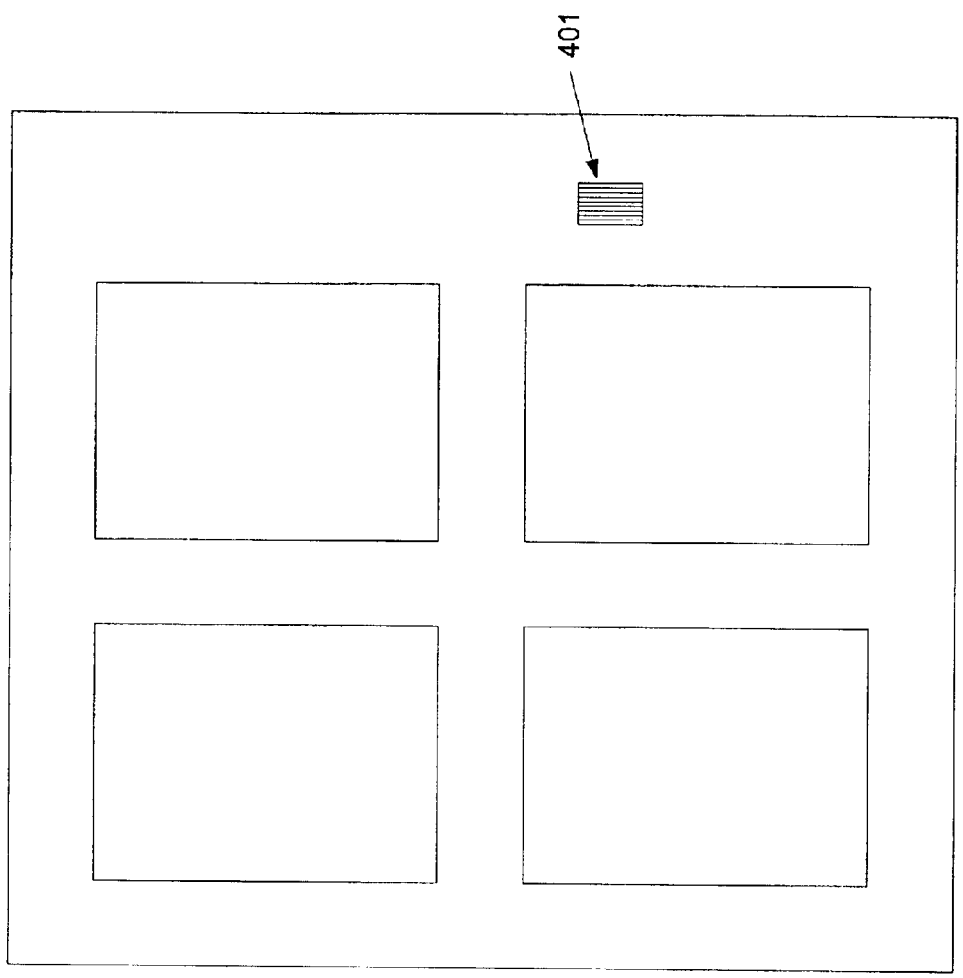
Figure 6-A

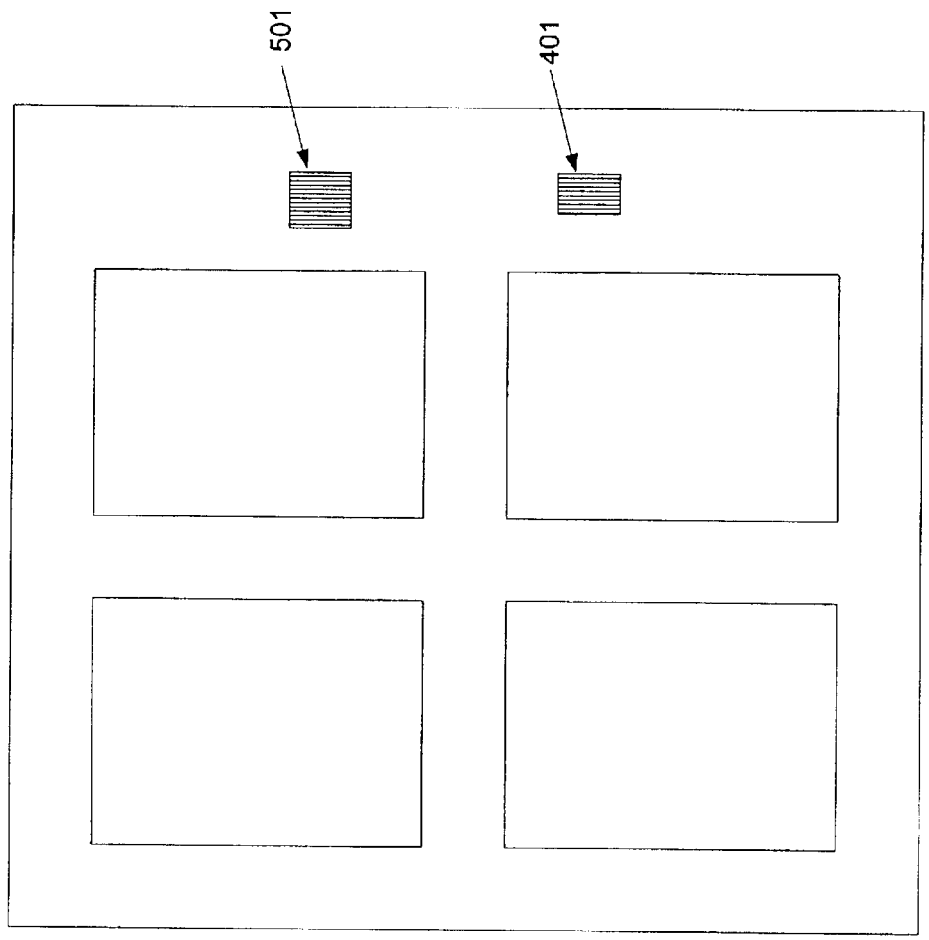
Figure 6-B

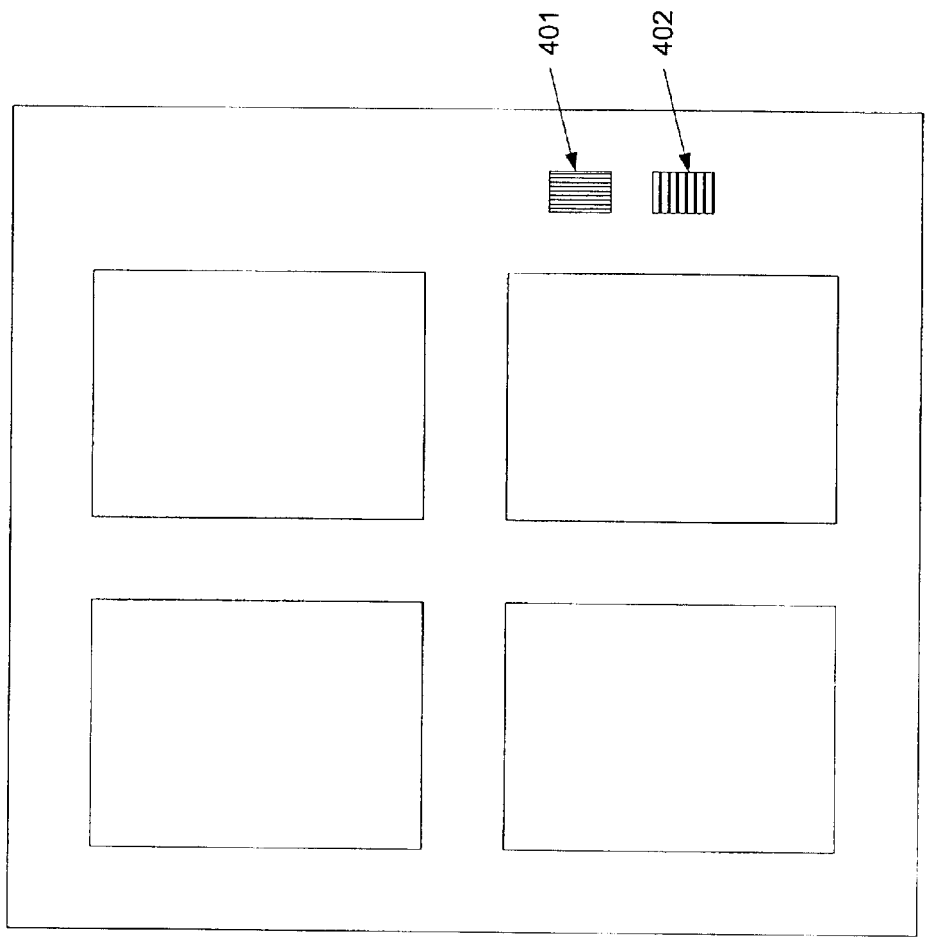
Figure 9-A

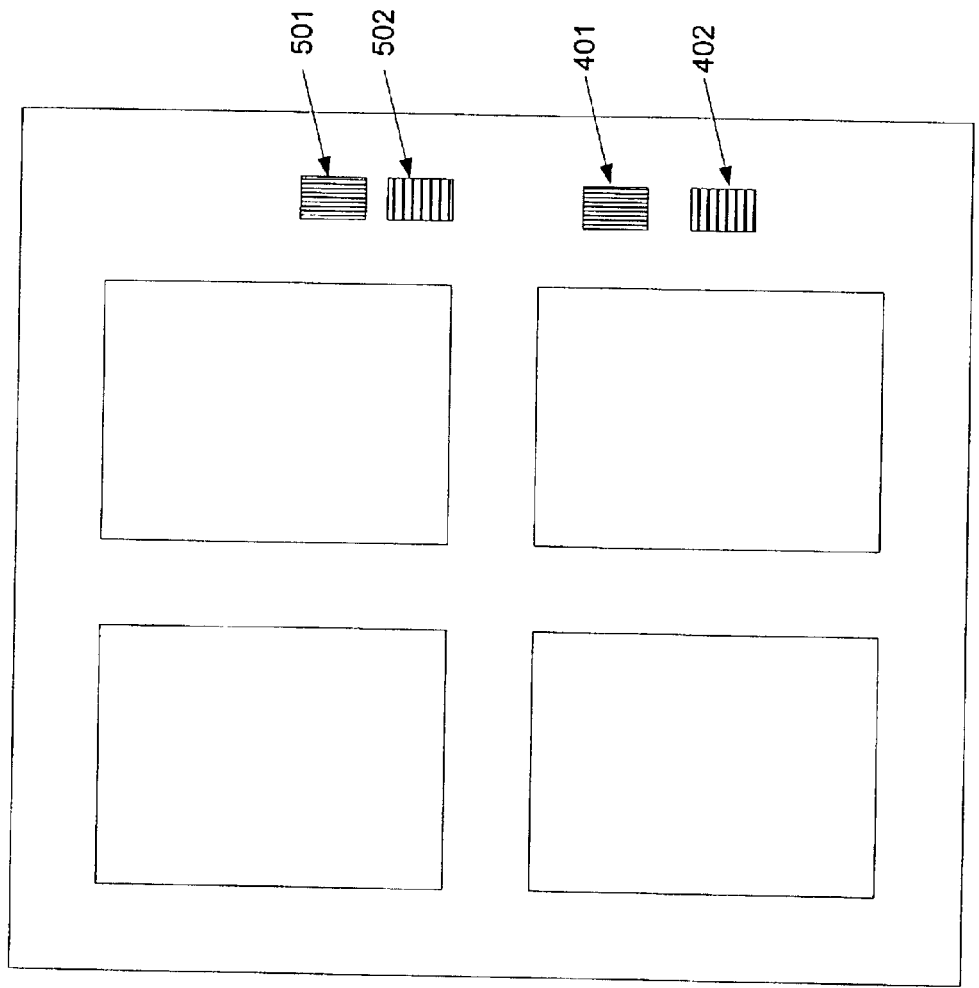
Figure 9-B

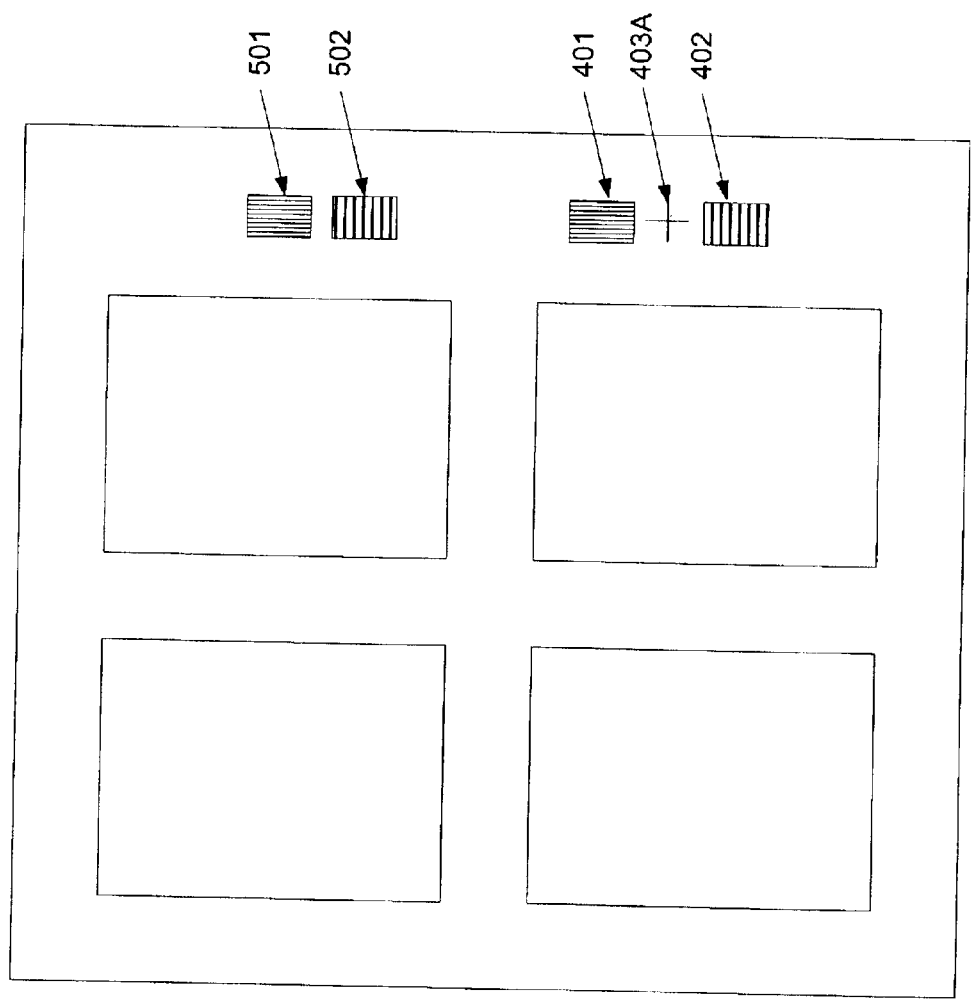
Figure 10-A

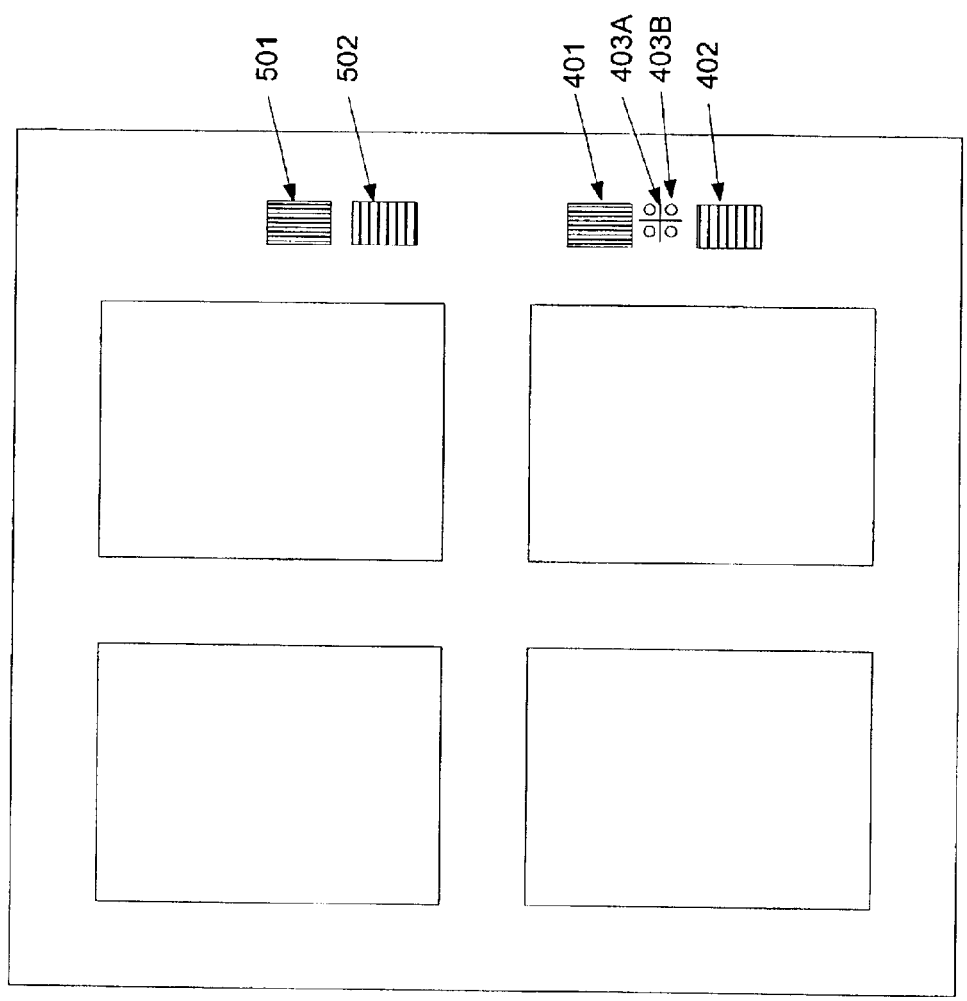
Figure 10-B

SINGLE PASS LITHOGRAPHY OVERLAY TECHNIQUE

CROSS-REFERENCE TO RELATED APPLICATIONS

This application relates to co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference.

BACKGROUND

1. Field

This application relates generally to circuit fabrication, and more specifically to mask alignment in a lithography process.

2. Related Art

The fabrication of semiconductors is a process requiring precision. Since the size of the structures defined by the masks in a lithography process are on the order of a micron or less, it is vital that the masks are aligned properly with very little deviation. As circuit components continue to shrink, mask alignment offset tolerance becomes ever smaller, causing mask alignment to become an increasingly difficult task.

SUMMARY

In one exemplary embodiment, a lithography process includes forming a first grating having lines and spaces on a wafer using a first mask having a pattern for the first grating. A second grating is formed having lines and spaces on the wafer using a second mask having a pattern for the second grating and also the pattern for forming the first grating. Any misalignment between the first and second masks can be determined based on the difference in either the width of the lines or width of the spaces of the first and second gratings formed on the wafer.

The present invention is better understood upon consideration of the detailed description below in conjunction with the accompanying drawings and claims.

BRIEF DESCRIPTION OF THE DRAWINGS

FIGS. 2-A through 2-E depicts an exemplary process for forming a grating;

FIGS. 6-A and 6-B depict exemplary gratings on a wafer used for measuring mask alignment.

FIGS. 9-A and 9-B depict exemplary gratings on a wafer used for measuring mask alignment.

FIGS. 10-A and 10-B depict exemplary gratings on a wafer used for measuring mask alignment.

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

Figure 1:
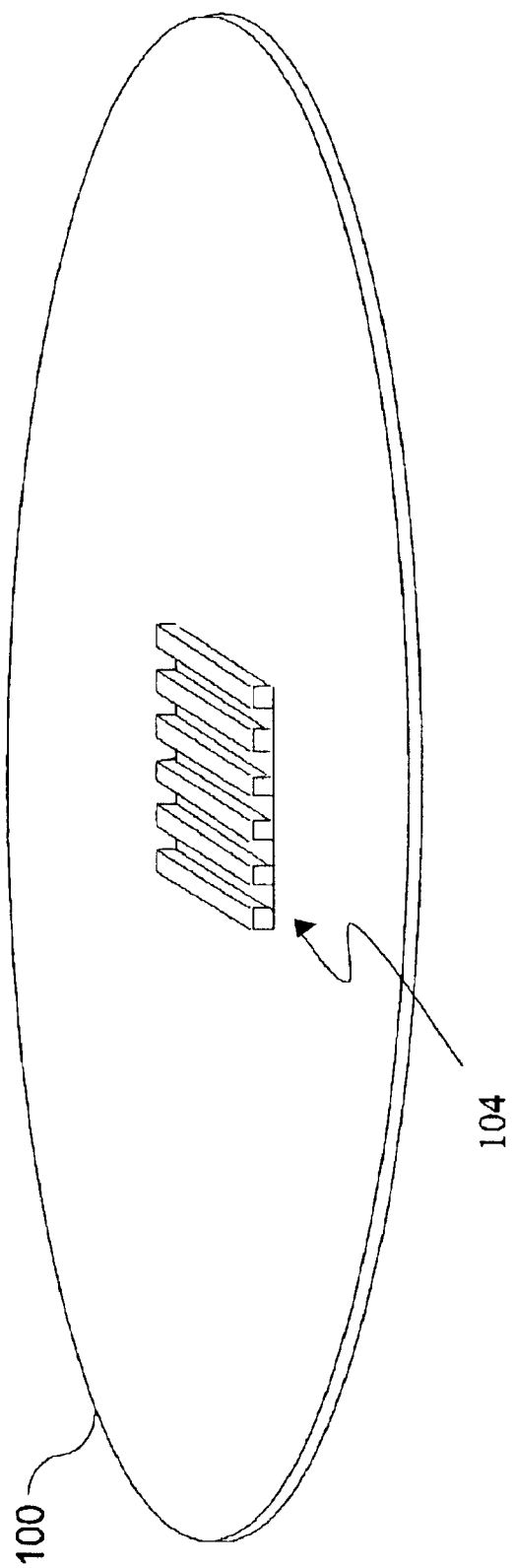
FIG. 1 depicts an exemplary semiconductor wafer and grating.

With reference to FIG. 1, the process of fabricating semiconductor devices/circuits on wafer 100 includes depositing and patterning layers of materials on wafer 100. More particularly, the features of the semiconductor devices/circuits are formed one layer at a time by depositing a layer of material, and then removing portions of the deposited layer of material.

The process of depositing the layers of material is generally referred to as a deposition process. Exemplary deposition processes include chemical vapor deposition (CVD), oxidation, spin coating, sputtering, and the like. Exemplary materials that are deposited include oxides, metals, and the like.

The process of forming features on the deposited layers of materials is generally referred to as a patterning process, which typically includes a photolithography process and an etching process. More particularly, in a typical lithography process, the features of the semiconductor device/circuit are laid out one layer at a time on a series of photomasks (masks). A single mask typically includes the layout for one layer of one or more chips throughout wafer 100. Multiple layers are typically deposited and patterned to form the features of semiconductor devices/circuits. As such, in forming these multiple layers, each mask, which corresponds to each layer, is aligned to properly form the features of the devices/circuits. Misalignment of the mask is typically referred to as an "overlay error." As noted earlier, because the structures defined by the mask in a lithography process are, for example, on the order of a micron or less, overlay error can adversely affect the performance of the semiconductor devices/circuits.

To measure the alignment, or misalignment, of masks, one or more gratings 104 can be formed in test areas on wafer 100 that are proximate to or within devices/circuits formed on wafer 100. For example, grating 104 can be formed adjacent a device/circuit formed on wafer 100. Alternatively, grating 104 can be formed in an area of the device/circuit that does not interfere with the operation of the device/circuit. Thus, the overlay measurements obtained for grating 104 can be used to determine whether the devices/circuits adjacent grating 104 have been fabricated according to specifications, i.e., whether the masks are misaligned. Further, with the use of gratings 104 and alignment direction targets, as described below, the direction and the magnitude of the misalignment can be determined.

With reference now to FIGS. 2-A through 2-E, an exemplary fabrication process is depicted for forming grating 104 (FIG. 1) on wafer 100 using a lithography process. As noted above, the fabrication process that forms grating 104 (FIG. 1) can also form devices/circuits of one or more chips throughout wafer 100. It should be noted that the following description is intended to be illustrative rather than comprehensive. As such, grating 104 (FIG. 1) can be formed on wafer 100 with fewer or more process steps.

With reference to FIG. 2-A, a first layer 200 is deposited on wafer 100. For the purpose of this example, assume that first layer 200 is a photoresist layer. First layer 200, however, can include various materials depending on the application, such as oxides, metals, polysilicon, and the like.

With reference to FIG. 2-B, a first mask 202 is positioned above wafer 100 and first layer 200. First mask 202 includes portions 204 that block light and portions 206 that transmit light. Portions 204 of first mask 202 that block light can be patterned to have the same shape as the features that are to be formed on first layer 200. These types of masks are generally referred to as "light field" masks. Alternatively, portions 206 of first mask 202 that transmit light can be patterned to have the same shape as the features that are to be formed on first layer 200. These types of masks are generally referred to as "dark field" masks. For the sake of convenience and clarity, first mask 202 is depicted and described as being a "light field" mask.

With reference to FIG. 2-C, first mask 202 is aligned relative to wafer 100 such that the features that are to be formed on first layer 200 are positioned in the proper intended location. When first mask 202 is properly aligned, first mask 202 and portions of first layer 200 are exposed to light. As depicted in FIG. 2-C, only certain portions of first layer 200 are exposed to the light, i.e., the portions under portions 206 (FIG. 2-B) of first mask 202 that transmit light.

As described above, in this example, first layer 200 is a photoresist layer, which has the material characteristic that its solubility is responsive to exposure to light. More particularly, some photoresist change from a soluble to an insoluble condition when exposed to light. These types of photoresist are generally known as "negatively acting" resist. In contrast, some photoresist change from an insoluble to a soluble condition when exposed to light. These types of photoresist are generally known as "positively acting" resist. For the sake of convenience and clarity, assume that first layer 200 is a "positively acting" resist.

With reference now to FIG. 2-D, when first layer 200 is exposed to an appropriate chemical solvent (i.e., a developer), the portions of first layer 200 that were exposed to the light are dissolved. The first mask 202 can then be stripped away and the developer and dissolved photoresist washed away. Thus, in the present example, the remaining portions of first layer 200 form ridges 208 of grating 104 (FIG. 1). As depicted in FIG. 2-D, ridges 208 are spaced regularly with a period of P1.

It should be noted that first mask 202 (FIG. 2-C) can be patterned to include the shapes of the features of one layer of the devices/circuits that are to be formed on wafer 100 (FIG. 1), and more particularly on first layer 200. As such, during the process of forming ridges 208 of grating 104 (FIG. 1), the features of one layer of devices/circuits are also being formed on first layer 200 of one or more chips throughout wafer 100.

With reference now to FIG. 2-E, as described below, in one exemplary embodiment, a second mask 204 having a pattern for grating 104 can be used to expose grating 104 for a second time. As also described below, a change in the width of the lines and/or spaces of grating 104 as a result of the second exposure can indicate misalignment between the first mask 202 (FIG. 2-C) and second mask 204.

Figure 3:
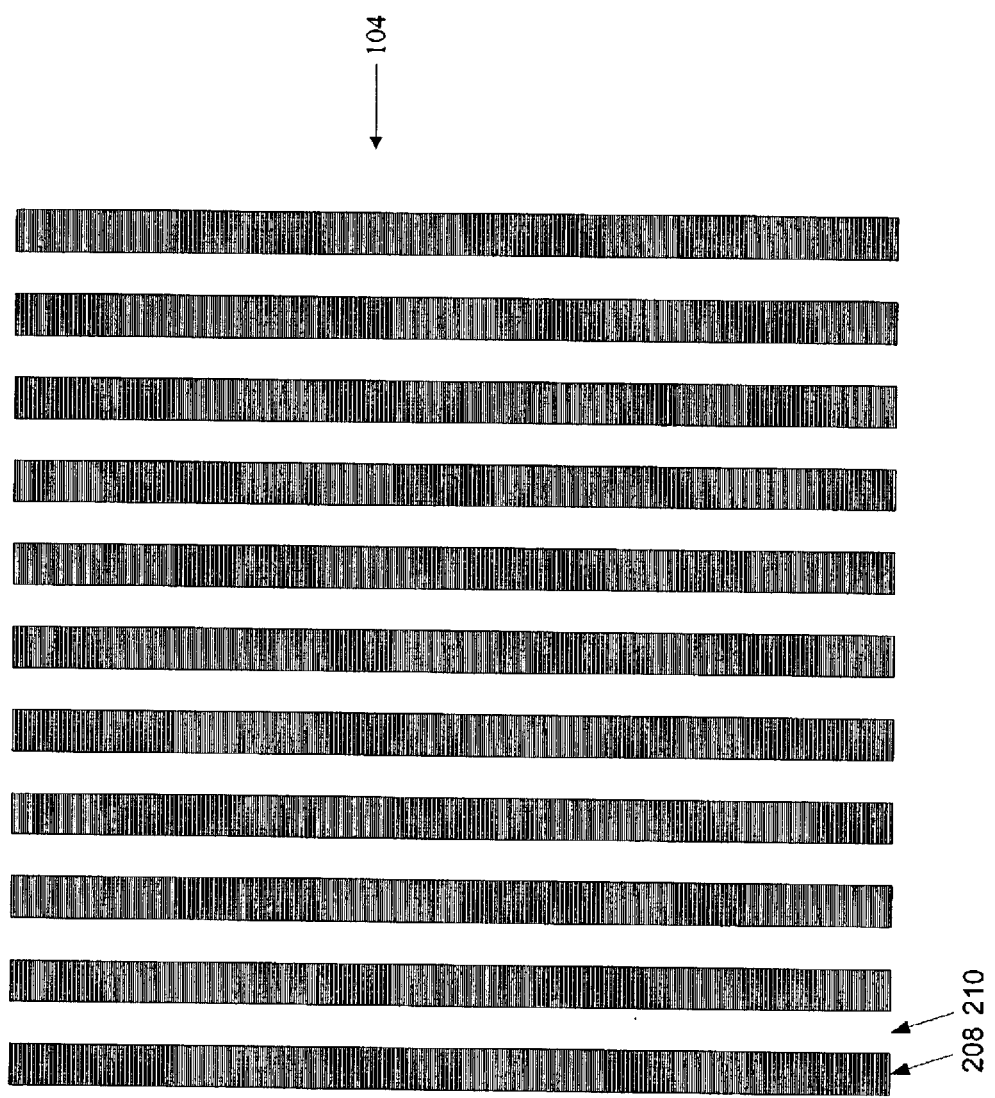
FIG. 3 depicts an exemplary grating pattern.

For example, FIG. 3 depicts a top view of grating 104 with lines 208 and spaces 210. Although the widths of lines 208 and spaces 210 are depicted as being equal, it should be recognized that the widths of lines 208 and spaces 210 can differ.

Figure 4:
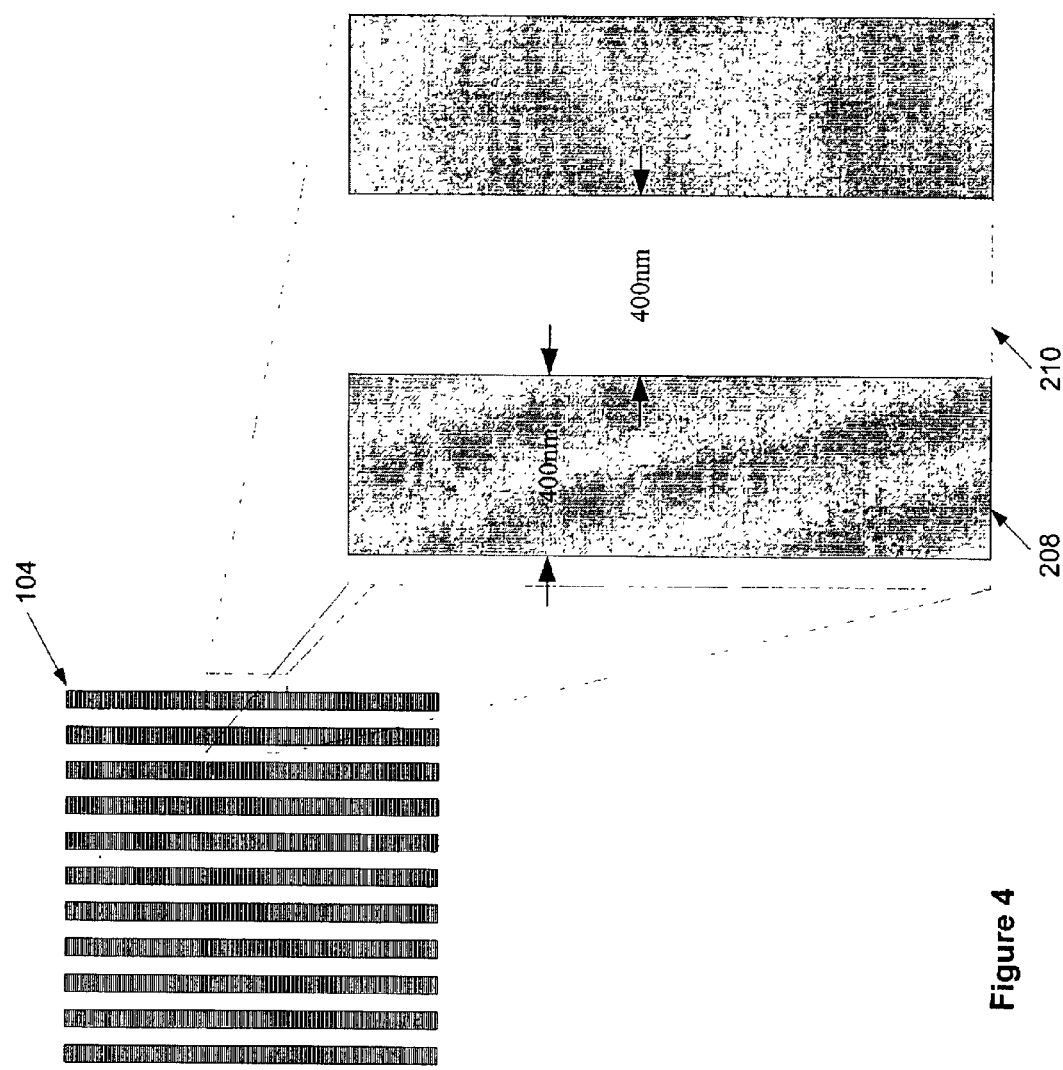
FIG. 4 depicts an exemplary grating after one exposure.
Figure 5:
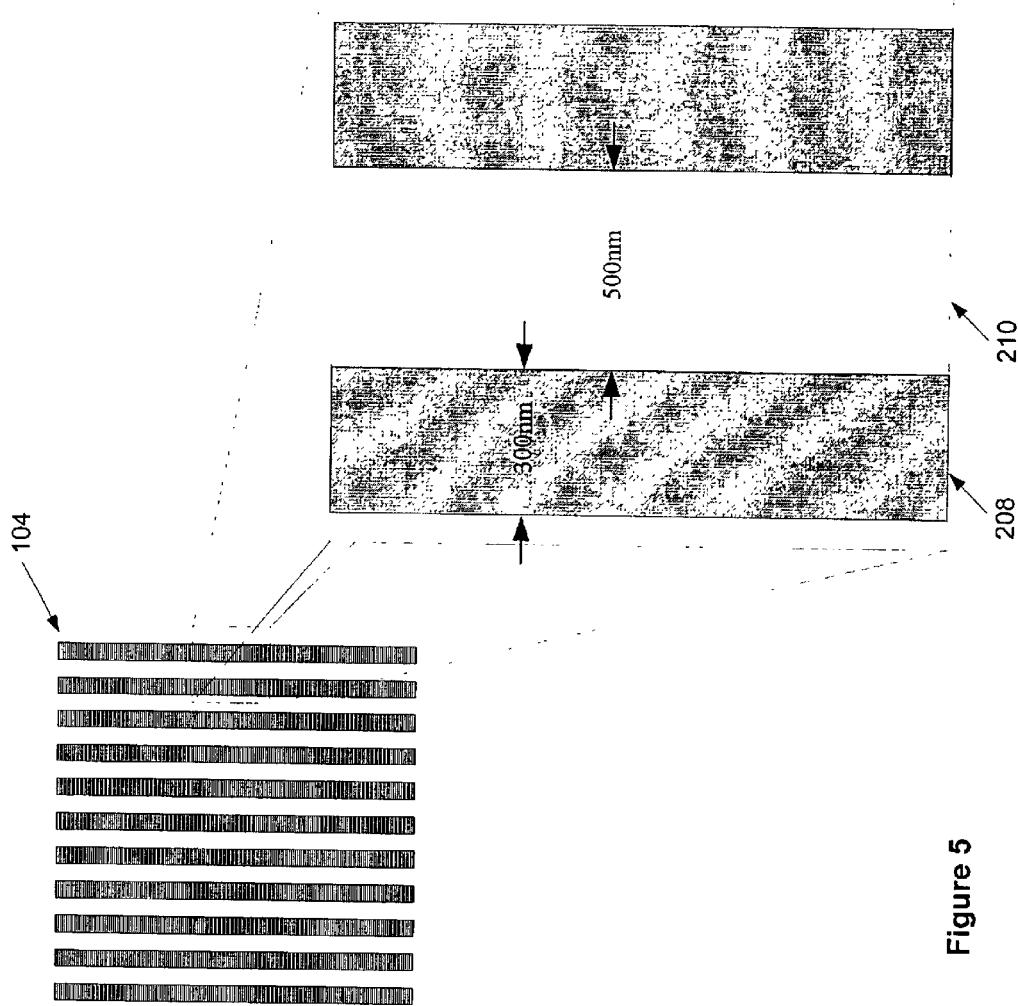
FIG. 5 depicts an exemplary grating after a second exposure.

With reference to FIG. 4, after the first exposure using mask 202 (FIG. 2-C), assume that grating 104 is initially formed on the wafer with lines 208 and spaces 210 having widths of 400 nm. With reference now to FIG. 5, after the second exposure using second mask 204. (FIG. 2-E), assume that the widths of lines 208 and spaces 210 of grating 104 are now 300 nm and 500 nm, respectively. This change in width indicates that second mask 204 (FIG. 2-E) used for the second exposure was not aligned with first mask 202 (FIG. 2-C).

Thus, the presence and amount of misalignment between first mask 204 (FIG. 2-C) and second mask 204 (FIG. 2-E) in the direction orthogonal to lines 208 and spaces 210 can be determined. For example, the difference in the widths of lines 208 between the first exposure to the second exposure can be used. Thus, in this example, the magnitude of misalignment is 100 nm (i.e., 400 nm after the first exposure—300 nm after the second exposure). Alternatively, the difference in widths of spaces 210 between the first exposure to the second exposure can be used. Thus, in this example, the amount of misalignment is 100 nm (i.e., 400 nm after the first exposure—500 nm after the second exposure). It should be recognized that the particular dimensions used in this example are for illustrative purposes only and that the specific values can vary.

With reference to FIG. 6-A, in one exemplary embodiment, a first grating 401 can be formed at a first location on a wafer. As described above, first grating 401 can be formed using a first mask having a pattern for grating 401. As also described above, the first mask used to form grating 401 can also have patterns to form devices/circuits of one or more chips throughout the wafer.

With reference to FIG. 6-B, in the present exemplary embodiment, a second grating 501 can be formed at a second location on the wafer. Second grating 501 can be formed using a second mask having a pattern for grating 501. In the present embodiment, the second mask also includes the pattern for grating 401 that was used in the first mask to form grating 401. Thus, first grating 401 is exposed twice and second grating 501 is exposed once during the lithography process.

After first grating 401 and second grating 501 are formed on the wafer with first grating 401 having been twice exposed during the lithography process, first grating 401 and second grating 501 can be used to determine if the first and second masks were aligned/misaligned. More particularly, the widths of the lines or spaces of first grating 401 and second grating 501 can be determined. The widths of the lines and/or spaces of first grating 401 and second grating 501 can then be compared to determine the presence and/or amount of misalignment between the first and second masks.

Figure 7:
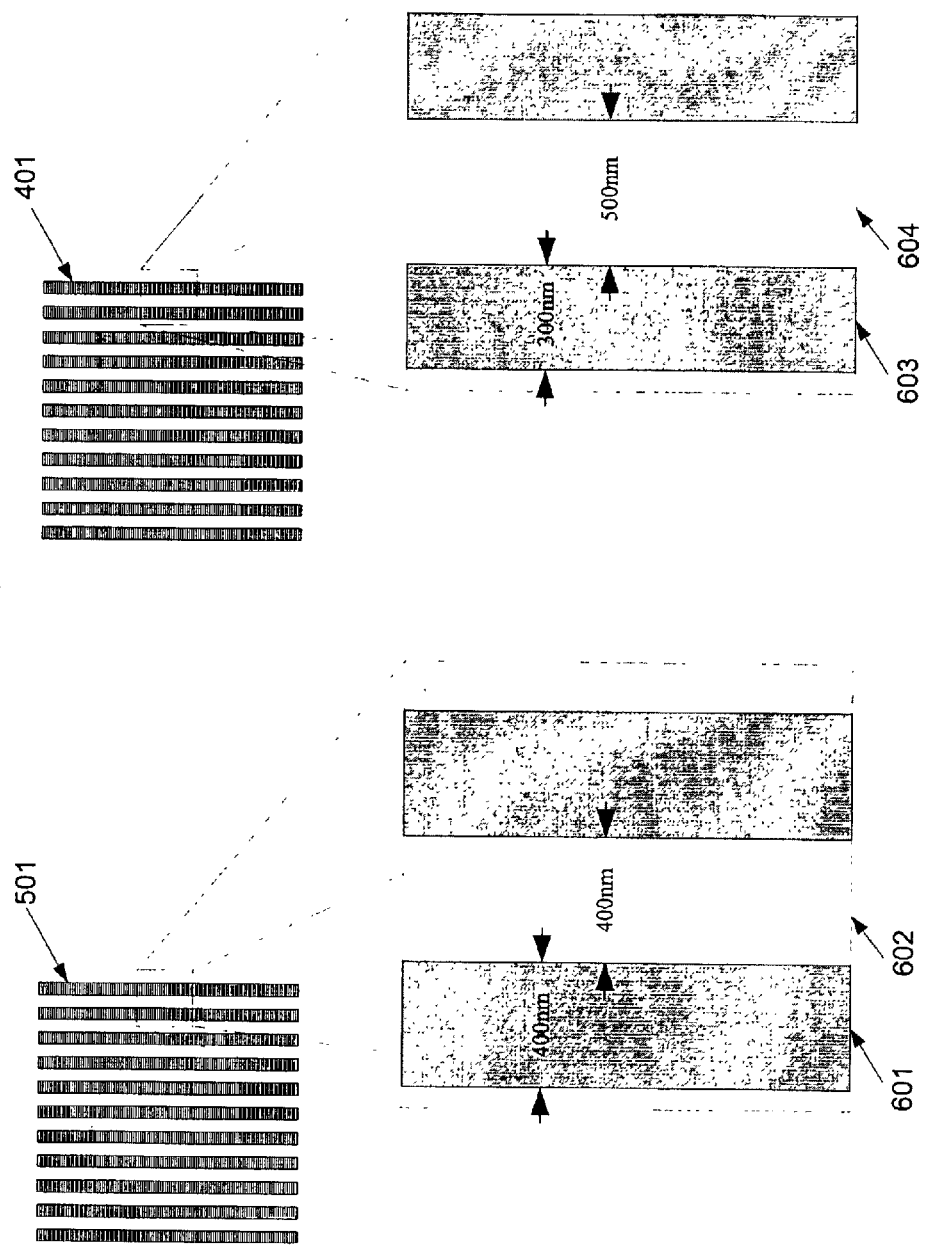
FIG. 7 is a top view of the exemplary gratings depicted in FIGS. 6A and 6-B.

For example, assume that the widths of the lines and spaces of first grating 401 and second grating 501 were intended to be the same. As depicted in FIG. 7, assume that the widths of lines 601 and spaces 602 of second grating 501 are determined to be 400 nm. Also assume that the widths of lines 603 and 604 of first grating 401 are determined to be 300 nm and 500 nm, respectively. Thus, a comparison between the widths of lines and/or spaces of first grating 401 and second grating 501 indicates that there has been a misalignment between the first and second masks. Additionally, in the present example, the amount of misalignment can be determined as 100 nm (i.e., 400 nm–300 nm and/or 400 nm–500 nm).

It should be recognized that the order in which the first and second masks are used can vary. Thus, in the context of the exemplary embodiment described above, second grating 201, which is exposed once, can be formed when first grating 201 is first formed or when first grating 201 is exposed for the second time. Thus, the first mask can be used before or after the second mask.

Figure 8:
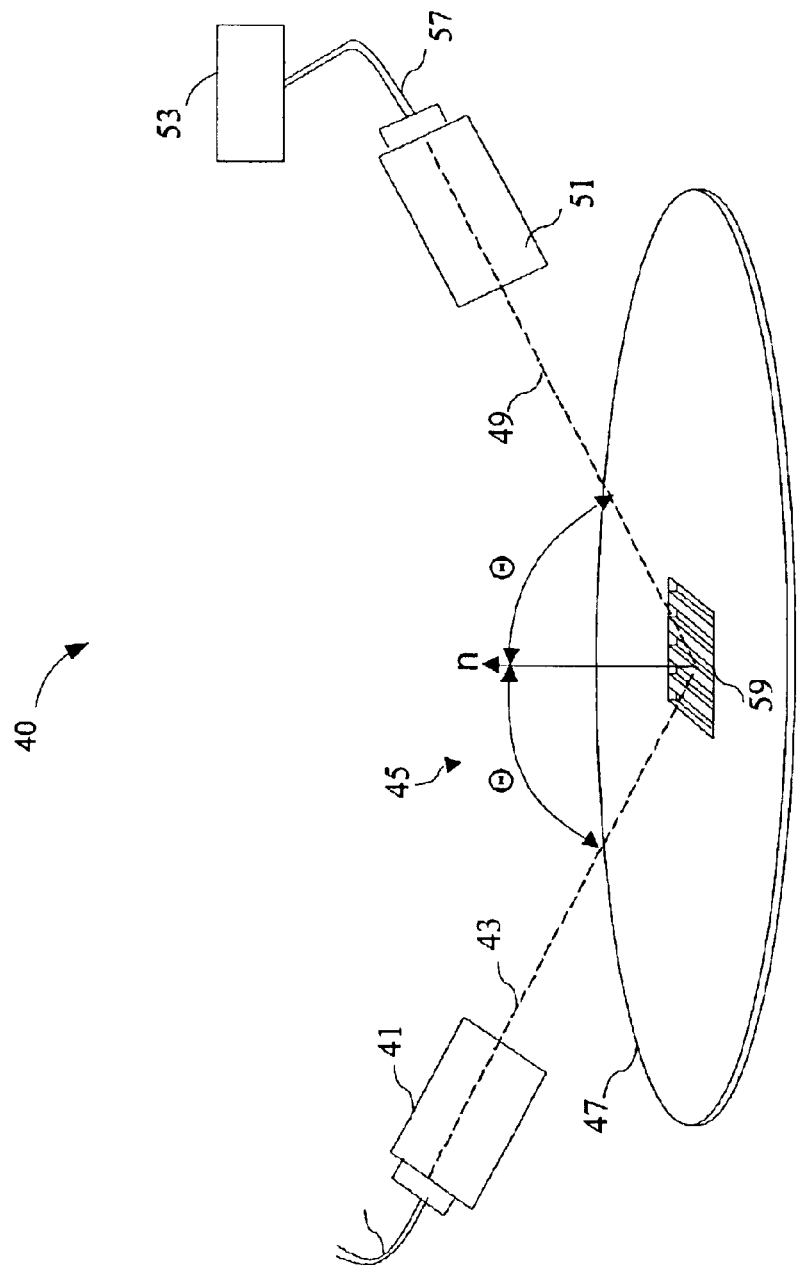
FIG. 8 depicts an exemplary architectural diagram illustrating the use of optical metrology to measure the diffraction signals off structures formed on a wafer.

In one exemplary embodiment, an optical metrology system can be used to determine the widths of the lines and/or spaces of the gratings. More particularly, with reference to FIG. 8, an exemplary optical metrology system 40 can be used to measure the diffraction signals off structures, including grating structures, formed on a wafer. The optical metrology system 40 includes a metrology beam source 41 projecting a beam 43 at the target structure 59 of a wafer 47. The metrology beam 43 is projected at an incidence angle θ towards the target structure 59. The diffraction beam 49 is measured by a metrology beam receiver 51. The diffraction beam data 57 is transmitted to a profile application server 53. The profile application server 53 compares the measured diffraction beam data 57 against a library of calculated diffraction beam data representing varying combinations of critical dimensions of the target structure and resolution. In one exemplary embodiment, the library instance best matching the measured diffraction beam data 57 is selected. The profile and associated critical dimensions of the selected library instance correspond to the cross-sectional profile and critical dimensions of the features of the target structure 59. The optical metrology system 40 may utilize a reflectometer, an ellipsometer, or other optical metrology device to measure the diffraction beam or signal. An optical metrology system is described in co-pending U.S. patent application Ser. No. 09/727,530 entitled "System and Method for Real-Time Library Generation of Grating Profiles" by Jakatdar, et al., filed on Nov. 28, 2000, and is incorporated in its entirety herein by reference.

With reference to FIG. 9-A, in one exemplary embodiment, gratings 401 and 402 can be formed on a wafer to determine mask alignment in two alignment directions. A first mask is used to form gratings 401 and 402 after a first exposure. The lines and spaces of grating 401 are aligned in a direction that is orthogonal to the alignment of the lines and spaces of the grating 402. For example, as depicted in FIG. 9-A, the lines and spaces of the grating 401 can be used to determine horizontal alignment, and the lines and spaces of the grating 402 can be used to determine vertical alignment. However, as described above, a single grating can be used to find the offset of a single component, i.e., the vertical or horizontal alignment.

With reference to FIG. 9-B, in the present embodiment, a second mask is used to form gratings 501 and 502, and also includes patterns for gratings 401 and 402 to superimpose and expose gratings 401 and 402 a second time. Thus, after the second exposure, gratings 401 and 402 have been exposed two times and gratings 501 and 502 once. As depicted in FIG. 9-B, grating 501 has lines and spaces to determine horizontal alignment, and grating 502 has lines and spaces to determine vertical alignment.

Gratings 501, 502, 401, and 402 can then be used to determine the alignment of the first and second masks in two alignment directions. More particularly, the widths of the lines and/or spaces of gratings 501, 502, 401, and 402 are determined. The widths of the lines and/or spaces of gratings 501 and 401 can be compared to determine the presence and/or amount of misalignment between the first and second masks in the horizontal direction. The widths of the lines and/or spaces of grating 502 and 402 can be compared to determine the presence and/or amount of misalignment between the first and second masks in the vertical direction.

As noted above, it should be recognized that gratings 501 and 502 can be formed when gratings 401 and 402 are first formed rather than when grating 401 and 402 are exposed for the second time. More particularly, with reference to FIG. 10-A, in one exemplary embodiment, using a first mask, gratings 401, 402, 501, and 502 are formed on a wafer. With reference to FIG. 10-B, in the present embodiment, using a second mask, grating 401 and 402 are exposed for a second time without exposing grating 501 and 502 for a second time.

As depicted in FIGS. 10-A and 10-B, in the present embodiment, an alignment direction target can be used to determine the direction of misalignment between the first and second masks. More particularly, with reference to FIG. 10-A, an alignment direction target element 403A can be formed on the wafer using the first mask. With reference to FIG. 10-B, an alignment direction target element 403B can be formed on the wafer using the second mask. An offset in the alignment direction target elements 403A and 403B can indicate the direction of a misalignment between the first and second masks.

For example, as depicted in FIG. 10-A, alignment direction target element 403A includes two orthogonal lines with intersecting midpoints, forming a cross pattern. As depicted in FIG. 10-B, alignment direction target element 403B includes four circles arranged such that if the first and second masks are aligned, alignment direction target element 403A, the cross, will be positioned between alignment direction target element 403B, the four circles. If the second mask is misaligned with respect to the first mask, the four circles will be offset with respect to the cross. Thus, the offset of the alignment direction target elements 403A and 403B can indicate the direction of the misalignment of the first or second mask based on the position of the circles relative to the cross.

Thus, in addition to measuring the magnitude of the misalignment, the direction of misalignment can be determined by measuring the difference between direction target elements 403A and 403B. For example, a charge-coupled device (CCD) camera connected to a computer running a pattern recognition algorithm, such as Cognex Patmax (Cognex Patmax is a trademark of Cognex Corporation of Natick, Mass., USA) or Matrox Imaging Library (available from Matrox Electronic Systems Ltd. of Dorval, Quebec, Canada), can be used to automate the determination process of the direction of misalignment. Using the CCD camera to capture an image of alignment direction target elements 403A and 403B, the pattern recognition algorithm can be used to determine the direction of offset in the horizontal and vertical directions.

As described above, in this example, alignment direction target elements 403A and 403B include two orthogonal lines with intersecting midpoints, forming a cross pattern, and four circles, one circle in each quadrant formed by the intersecting lines. It should be recognized that the circles could be alignment direction target element 403B and the cross could be alignment direction target element 403A. Additionally, it should be recognized that alignment direction target elements 403A and 403B can include various patterns, shapes, and sizes. Furthermore, alignment direction target elements 403A and 403B may be used to align and determine the direction of misalignment, of masks to an alignment direction target element located on an underlying wafer.

Figure 11:
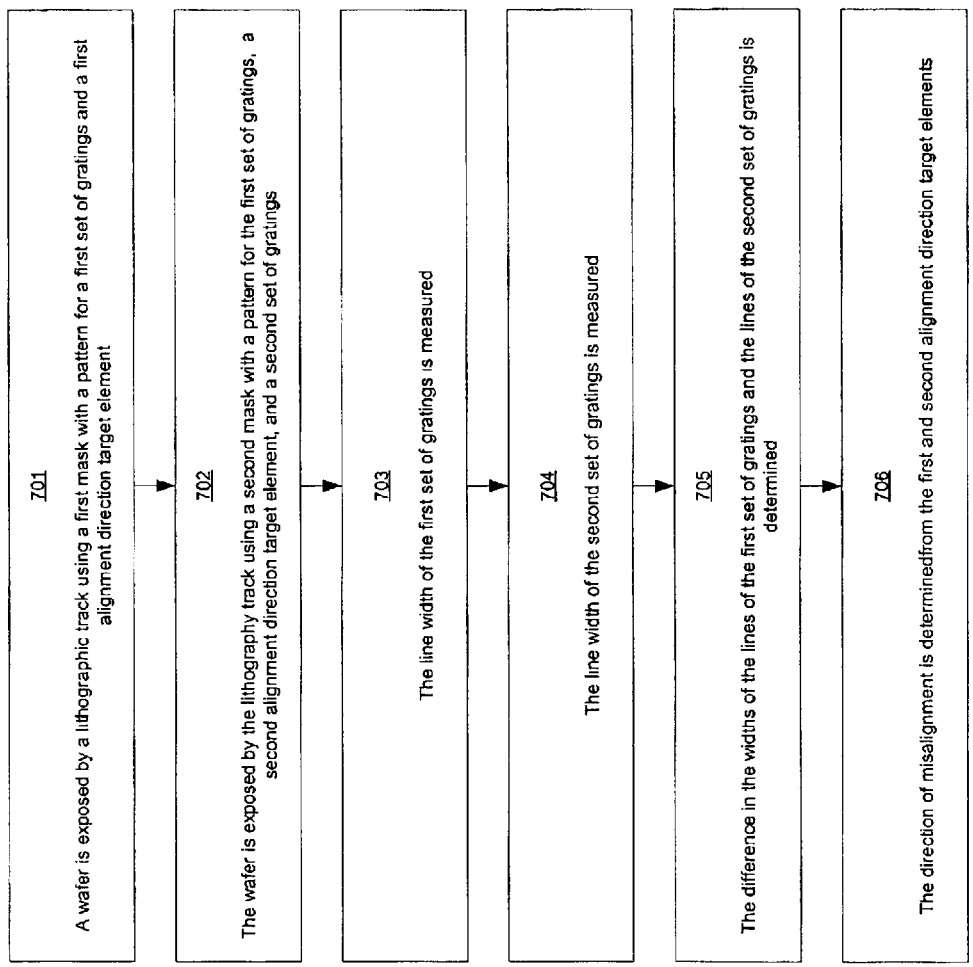
FIG. 11 depicts an exemplary flow chart representing the process of measuring the alignment of masks.

FIG. 11 depicts an exemplary flow chart representing the process of measuring the misalignment of masks. First, a wafer is exposed by the lithography track using a first mask with a first set of gratings and a first alignment direction target element in 701. The wafer is then exposed by the lithography track using a second mask. The second mask includes a pattern for the first set of gratings, a second alignment direction target element, and a second set of gratings in 702. The line width of the first set of gratings is measured in 703, and the line width of the second set of gratings is measured in 704. The difference in the widths of the lines of the first set of gratings and the second set of gratings is determined in 705. As described above, this difference is the magnitude of misalignment, if any. As also disclosed above, the direction of misalignment can be determined from the first and second alignment direction target elements in 706.

It should be recognized, however, that numerous modifications can be made to the process depicted in the flow chart. For example, the first mask can include a pattern for the first set of gratings and the second set of gratings. The second mask can include only a pattern for the first set of gratings in the same location. Further, in 703 and 704, other characteristics of the gratings could be measured, such as the width of the spaces, the diffraction characteristics of the grating, or the like. Additionally, the order of various process depicted can be performed differently, such as performing 704 prior to 703, or performing 706 prior to 705. Thus, the process, including the order, is for exemplary purposes only.

Figure 12:
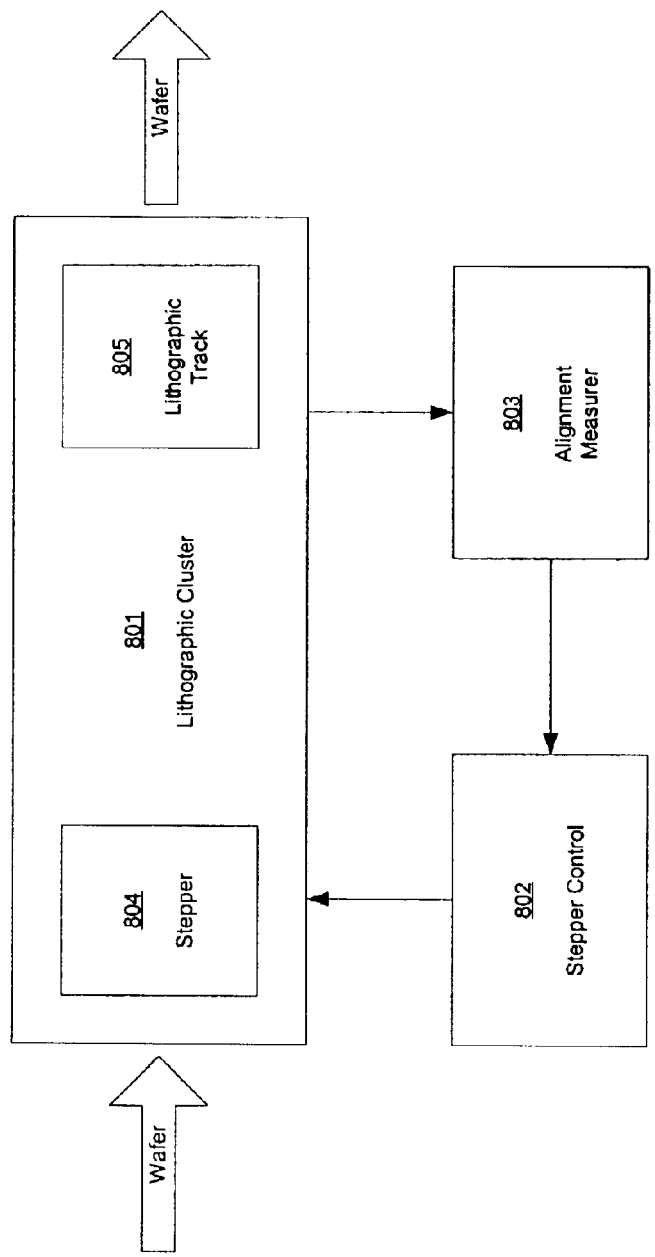
FIG. 12 depicts an exemplary block diagram of a closed loop control system that can be used in a stepper or lithographic alignment tool to adjust in order to compensate for the measured misalignment.

FIG. 12 depicts an exemplary block diagram of a closed loop control system that can be used in a lithographic cluster 801 for automatically adjusting the process to compensate for a measured overlay misalignment, where a lithographic cluster 801 can include a lithographic track 805 and a stepper 804, or exposing device. Coupled to the lithographic cluster 801 are an alignment measurer 803 and a stepper control 802. The alignment measurer 803 is also coupled to the stepper control 802. The lithographic cluster 801 processes a first wafer. While still in the lithographic cluster 801 the magnitude and direction of misalignment is determined by the alignment measurer 803 using, for example, the processes described above. The raw data values and/or simply the direction and magnitude of misalignment are fed-back to the stepper control 802. The stepper control 802 can use the data to adjust the stepper 804 of the lithographic cluster 801 to reduce or eliminate the misalignment, and a second wafer can be processed with greater precision. This control loop can be used on every wafer processed by the lithographic cluster 801 without having to remove the wafer from the lithographic cluster 801. This control loop allows re-alignment of the stepper 804 in the lithographic cluster 801 to be performed at anytime. In addition, this control loop allows re-alignment of the stepper 804 in the lithographic cluster 801 to be performed in a continuous manner.

Foregoing described embodiments of the invention are provided as illustrations and descriptions. They are not intended to limit the invention to precise form described. In particular, Applicants contemplate that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by claims following.

We claim:

1. A lithography method, comprising:

forming a first grating having lines and spaces on a wafer using a first mask having:
a pattern for the first grating;

forming a second grating having lines and spaces on the wafer using a second mask having:
a pattern for the second grating, and
the pattern for the first grating; and determining if the first and second masks have been misaligned based on a difference in either the width of the lines or the width of the spaces of the first and second gratings formed on the wafer.

2. The method of claim 1, wherein the first mask is exposed before the second mask to form the first grating before forming the second grating, and wherein the first grating is exposed again through the pattern for the first grating on the second mask when the second grating is formed.

3. The method of claim 1, wherein the second mask is exposed before the first mask to form the first grating and the second grating at the same time, and wherein forming a first grating having lines and spaces on a wafer using a first mask comprises:
exposing the first grating again through the pattern for the first grating on the first mask after the first grating has been formed using the second mask.

4. The method of claim 1, further comprising:

forming a first alignment direction target element using the first mask;

forming a second alignment direction target element using the second mask.

5. The method of claim 4, further comprising:

determining a direction of misalignment between the first and second masks based on a difference between the first and second alignment direction target elements formed using the first and second masks.

6. The method of claim 5, wherein the difference between the first and second alignment direction target elements is measured using a charge-coupled device camera.

7. The method of claim 1, further comprising:

measuring the width of the lines or the width of the spaces of the first grating using optical metrology; and measuring the width of the lines or the width of the spaces of the second grating using optical metrology.

8. The method of claim 1, wherein the lines and spaces of the first and second gratings are formed in a first direction, and wherein the difference between the width of either the lines or the spaces of the first and second gratings indicates the amount of misalignment between the first and second masks in a second direction orthogonal to the first direction.

9. The method of claim 1, further comprising:

forming a third grating using the first mask,
wherein the first mask includes a pattern for the third grating;

forming a fourth grating using the second mask,
wherein the second mask includes a pattern for the fourth grating and the pattern for the third grating;

determining if the first and second masks have been misaligned in a first direction based on the first and second gratings; and determining if the first and second masks have been misaligned in a second direction based on the third and fourth gratings.

10. The method of claim 9,
wherein the first mask is exposed before the second mask to form the first and third gratings before forming the second and fourth gratings, and
wherein the first and third gratings are exposed again through the pattern for the first and third gratings on the second mask when the second and fourth gratings are formed.

11. The method of claim 9,
wherein the second mask is exposed before the first mask to form the first, second, third, and fourth gratings at the same time, and
wherein forming a first grating having lines and spaces on a wafer using a first mask and forming a third grating comprises:
exposing the first and third gratings again through the patterns for the first and third gratings on the first mask after the first and third gratings have been formed using the second mask.

12. A lithography method comprising:
exposing a first mask having:
a pattern for a first grating;
exposing a second mask having:
a pattern for a second grating, and
the pattern for the first grating; and
determining alignment of the first and second masks based on the first and second gratings formed on a wafer after exposing the first and second masks.

13. The method of claim 12, wherein the first mask is exposed before the second mask to form the first grating on the wafer before forming the second grating on the wafer.

14. The method of claim 12,
wherein the second mask is exposed before the first mask to form the first and second gratings at the same time, and
wherein the first grating is exposed for a second time through the pattern for the first grating in the second mask when the second mask is exposed.

15. The method of claim 12,
wherein the first mask includes a pattern for a first alignment direction target element, and
wherein the second mask includes a pattern for a second alignment direction target element.

16. The method of claim 15, further comprising:
determining a direction of misalignment between the first and second masks based on a difference between the first and second alignment direction target elements formed using the first and second masks.

17. The method of claim 16, wherein the difference between the first and second alignment direction target elements is measured using a charge-coupled device camera.

18. The method of claim 12, further comprising:
measuring the first grating using optical metrology; and
measuring the second grating using optical metrology.

19. The method of claim 12,
wherein the first mask includes a pattern for a third grating;
wherein the second mask includes a pattern for a fourth grating and the pattern for the third grating;
determining alignment of the first and second masks in a first direction based on the first and second gratings; and
determining alignment of the first and second masks in a second direction based on the third and fourth gratings.

20. The method of claim 19,
wherein the first mask is exposed before the second mask to form the first and third gratings before forming the second and fourth gratings, and
wherein the first and third gratings are exposed again through the pattern for the first and third gratings on the second mask when the second and fourth gratings are formed.

21. The method of claim 19,
wherein the second mask is exposed before the first mask to form the first, second, third, and fourth gratings at the same time, and
wherein the first and third gratings are exposed again through the patterns for the first and third gratings on the first mask after the first and third gratings have been formed using the second mask.

22. A method of detecting misalignment between masks used in a lithography process, the method comprising:
forming a grating having lines and spaces on a wafer using a first mask;
measuring the width of the lines or spaces of the grating formed on the wafer;
exposing the grating formed on the wafer a second time using a second mask having a pattern for the grating;
measuring the width of the lines or spaces of the grating after the grating formed on the wafer is exposed a second time; and
determining if the first and second masks were misaligned based on a difference in the width of the lines or spaces measured after the grating is formed on the wafer and measured after the grating formed on the wafer is exposed a second time.

* * * * *